United States Patent

Ward-Close et al.

[11] Patent Number: 6,129,951
[45] Date of Patent: Oct. 10, 2000

[54] APPARATUS AND METHOD FOR MATRIX COATING FIBRES WITH METAL VAPOUR

[75] Inventors: Charles M. Ward-Close; Lakshman Chandrasekaran, both of Farnborough, United Kingdom

[73] Assignee: The Secretary of State for Defence in Her Britannic Majesty's Government of the United Kindgom of Great Britain and Northern Ireland, Farnborough, United Kingdom

[21] Appl. No.: 09/142,086
[22] PCT Filed: Mar. 24, 1997
[86] PCT No.: PCT/GB97/00793
    § 371 Date: Sep. 1, 1998
    § 102(e) Date: Sep. 1, 1998
[87] PCT Pub. No.: WO94/36021
    PCT Pub. Date: Oct. 2, 1997

[30] Foreign Application Priority Data

Mar. 25, 1996 [GB] United Kingdom .................. 9606228

[51] Int. Cl.[7] .............................. C23C 14/56; C23C 14/24
[52] U.S. Cl. .................................. 427/255.24; 427/255.5; 118/724; 118/726; 118/730
[58] Field of Search ............................... 427/212, 255.24, 427/255.5, 248.1, 591, 592; 118/726, 724, 729, 730

[56] References Cited

U.S. PATENT DOCUMENTS

| 4,886,680 | 12/1989 | Tindall | 427/179 |
|---|---|---|---|
| 5,378,500 | 1/1995 | Ward-Close et al. | 427/250 |
| 5,501,906 | 3/1996 | Deve | 428/366 |
| 5,660,923 | 8/1997 | Bieler et al. | 427/370 |
| 5,674,562 | 10/1997 | Claar et al. | 427/248.1 |

FOREIGN PATENT DOCUMENTS

| 92 14 860 | 3/1992 | WIPO . |
|---|---|---|
| 92 14860 | 3/1992 | WIPO . |

Primary Examiner—Timothy Meeks
Assistant Examiner—Bret Chen
Attorney, Agent, or Firm—Nixon & Vanderhye P.C.

[57] ABSTRACT

A physical vapour deposition apparatus for pre-coating fibres of a reinforcement material with a predetermined thickness of matrix metal prior to consolidation to yield a metal matrix composite material comprises: at least one evaporation crucible; a heater for heating a charge of metal in the at least one evaporation crucible to a temperature at which an appreciable vapour pressure is generated and a flux of metal vapour is evolved; a powered take-up device for drawing the reinforcement through the apparatus, and a guide mechanism for guiding the reinforcement repeatedly through the vapour flux, and to effect twisting of the reinforcement about its longitudinal axis after each successive pass through the vapour flux by an amount which is a fraction of 180°. The guide mechanism comprises a pair of multi-pass transfer rollers each having a multiplicity of concentric fibre-receiving grooves formed on its surface. The transfer rollers are positioned above the evaporation crucible or crucibles and spaced apart from each other with their rotational axes parallel. At least one of the transfer rollers comprises a plurality of independently-rotatable sub-rollers.

11 Claims, 4 Drawing Sheets

APPARATUS AND METHOD FOR MATRIX COATING FIBRES WITH METAL VAPOUR

BACKGROUND OF THE INVENTION

1. Field of the Invention

The present invention relates to apparatus for coating monofilaments of ceramic reinforcing materials such as silicon carbide with a predetermined thickness of matrix metal by a process of physical vapour deposition. Subsequently, the coated reinforcement may be consolidated into a metal matrix composite material having a controlled fibre spacing.

2. Discussion of Prior Art

Fibre reinforced metal matrix composites offer combinations of strength, stiffness and elevated temperature performance which are unattainable with conventional structural materials. As a result, they are currently under consideration for a wide range of applications in aerospace technology.

Typical matrix materials include titanium, aluminium or their alloys. Especially preferred are alloys of these elements which are capable of undergoing superplastic deformation.

Hitherto, the use of titanium as a matrix material has been largely confined to solid state processes undertaken at relatively low temperatures (1000° C.) because of the high chemical reactivity of titanium. One well-known technique is the so-called "foil-fibre" method in which alternate layers of metal foils and ceramic fibres are hot pressed together to give a fully dense product. This process is reasonably successful for flat products, but problems sometimes arise due to incompatibility between the foil and the reinforcement. In addition, some movement of the fibres is inevitable, possibly leading to touching fibres and local inhomogeneity in the structure. A variant of the foil-fibre method uses alloy powders mixed with an organic binder and rolled into a cloth as an alternative to the metal foil. This alternative method suffers from the same risks of fibre movement but allows a greater variety of matrix materials to be used by mixing of powders.

SUMMARY OF THE INVENTION

The method of pre-coating by physical vapour deposition used in the present invention provides a matrix coating on each fibre of sufficient thickness and uniformity that the desired matrix volume fraction is achieved in the finished composite. There is no need for any further matrix material to be added during the consolidation stage. In addition, fibre spacing in the finished product is predetermined by the thickness of the matrix coating. Inadvertent movement of the fibres does not affect their spacing. Another advantage of the pre-coating method is that the ceramic fibre is protected from damage, both during handling and also whilst undergoing consolidation.

It is known to produce metal matrix composite materials from titanium alloy and long fibre reinforcements by a process which involves laying together the reinforcement fibres and thin foils of the matrix alloy. These are then consolidated under conditions which cause superplastic flow within the matrix material and subsequent diffusion bonding. This known method has two major disadvantages. Firstly, it is limited by the choice of matrix alloys because foils are not necessarily available with the desired composition. Secondly, control of fibre spacing is not easily achievable across the full range of fibre/matrix volume ratios that might be desired.

It is also known to use liquid metal infiltration for the production of certain types of long fibre metal matrix materials. Unfortunately, this is unsuitable for composites with a titanium or titanium alloy matrix because of the high reactivity of liquid titanium. As a result of this reactivity, undesirable reactions take place between the matrix material and the reinforcement during the infiltration stage.

In Japanese Patent Application No. 63-56625, a continuous vapour coating apparatus is described which is said to be suitable for coating either fibres or films. The specification gives no information about the nature of the coating material, but the apparatus includes a reversing reel which turns the fibre (or film) over for its return pass through the coating station. No provision is made for presenting intermediate aspects of the fibre to the coating flux. As a result, the fibre is only superficially coated at its "edges". Thus, the apparatus is better-suited to the coating of planar webs of material where the depth of coating at the edges is of lesser importance. Such an apparatus is unsuitable for producing fibres with a uniform coating.

In the Applicant's earlier International Patent Application No. WO 92/14860, an apparatus is described in which a mono-filamentary fibre executes a plurality of passes between a pair of transfer rollers suspended above an evaporation bath. In one form of the apparatus, the fibre is additionally passed around a twist roller. The purpose of the twist roller is to re-orient the fibre so that different aspects of the fibre are exposed to metal vapours rising from the evaporation bath. Physical vapour deposition is a line-of-sight process, so it is important to expose the fibre in different orientations in order to achieve a uniform coating around its circumference.

The disadvantages of the arrangement described above are that the twist roller increases the complexity and the bulk of the apparatus. Also, the number of passes through the vapour flux is low, so the transport speed must be slow in order to achieve a sufficient depth of matrix coating. Although acceptably uniform coatings have been achieved using this apparatus, it does not lend itself to large-scale production.

In another embodiment, the twist roller is omitted and instead the apparatus uses a pair of transfer rollers, each of which has a series of fibre-receiving concentric grooves formed on its surface. As the fibre passes from one roller to another in a figure-of-eight path, frictional contact between the fibre and the groove sides impart a slight twist to the fibre. As a result, when the fibre has made a large number of passes (for example, 100 or more), through the vapour flux, a uniform coating is obtained around the fibre circumference.

It has been found that the second embodiment described above suffers from the drawback of uneven fibre tension across the transfer rollers. In particular, it has been found that the fibre loops near the ends of the transfer rollers have comparatively high tension, whilst the fibre loops on the central portions of the rollers tend to be relatively loose. As a result of this, the fibre has been known to lift from its groove in one or other of the transfer rollers and to occupy a groove which already contains another loop of the fibre. When this occurs, increased frictional forces often lead to fibre breakage. It is therefore an object of the present invention to provide an improved apparatus for matrix coating of a mono-filamentary fibre with metal vapour. In particular, it is an object of the present invention to provide an apparatus with improved fibre transport to reduce the risk of fibre breakage during the coating stage.

In one aspect the invention provides a physical vapour deposition apparatus for pre-coating fibres of a reinforcement material with a predetermined thickness of matrix metal prior to consolidation to yield a metal matrix composite material, the apparatus comprising:

at least one evaporation crucible;

heating means for heating a charge of metal in the or each evaporation crucible to a temperature at which an appreciable vapour pressure is generated and a flux of metal vapour is evolved;

a powered take-up device for drawing the reinforcement through the apparatus, and a guide mechanism for guiding the reinforcement repeatedly through the vapour flux, the guide mechanism including means to effect twisting of the reinforcement about its longitudinal axis after each successive pass through the vapour flux by an amount which is a fraction of 180°, thereby exposing a different aspect of the reinforcement to the vapour flux during each pass, wherein the guide mechanism comprises a pair of multi-pass transfer rollers each formed on its surface with a multiplicity of concentric fibre-receiving grooves, said transfer rollers being positioned above the evaporation crucible or crucibles and spaced apart from each other with their rotational axes parallel, at least one of said transfer rollers being comprised of a plurality of independently-rotatable sub-rollers sharing the same axis of rotation.

The advantage of the arrangement of the invention is that differential tension in the fibre is eliminated as it passes through the coating stage. If there is a local increase in tension, individual sub-rollers are able to rotate at different speeds about the shared axis to compensate for the tension build-up and thereby maintain substantially even tension across the width of the transfer rollers.

Preferably, the number of fibre-receiving concentric grooves in each sub-roller lies in the range from 1 to 10. Good results have been achieved with sub-rollers having from 5 to 8 such grooves. Whilst it might be thought that best results would be obtained from an assembly of single-grooved sub-rollers, the Applicant believes that this degree of independence of rotation is unnecessary. Indeed, it is both technically complex and expensive to equip an entire transfer roller with independent bearings for each single-grooved sub-roller. The middle range given above represents a sensible compromise. Sub-rollers with more than 10 grooves increase the likelihood of fibre breakage due to build up of differential tension across the windings.

It is not essential for the number of grooves in each sub-roller to be the same across the entire width of a transfer roller. However, this is the most convenient arrangement because all components of the transfer rollers are then of uniform configuration and interchangeable.

Typically, the width of the fibre-receiving grooves in the transfer rollers is between 4 and 25 times as great as the diameter of the uncoated fibre. The depth of the fibre-receiving grooves may be up to 100 times as great as the uncoated fibre diameter. These relative dimensions ensure that the fibres are unable to migrate from the grooves during transport through the coating station, even if differences in tension arise. Also, the generous tolerances in groove sizes allow for thermal movement of the roller elements without risk of fibre pinching, and also for the increase in width of the fibre as its coating grows in thickness. The root portion of the grooves may be radiused.

The apparatus may further comprise a so-called "dancing arm" between the fibre supply spool and the first transfer roller. The dancing arm is spring-biased to impart an initial tension to the fibre before it is loaded onto the arrangement of transfer rollers. Conveniently, the dancing arm has a jockey wheel at its extremity over which the fibre passes. In a second aspect the present invention provides a method for pre-coating fibres of a reinforcement material with a predetermined thickness of matrix metal prior to consolidation to yield a metal matrix composite material, comprising;

passing the reinforcement material over at least one evaporation crucible;

heating a charge of metal in the or each evaporation crucible to a temperature at which an appreciable vapour pressure is generated and a flux of metal vapour is evolved;

drawing the reinforcement material across the or each evaporation crucible by means of a powered take-up device, and guiding the reinforcement material repeatedly through the vapour flux by means of a guide mechanism which comprises a pair of multi-pass transfer rollers each formed on its surface with a multiplicity of concentric fibre-receiving grooves, said transfer rollers being positioned above the evaporation crucible or crucibles and spaced apart from each other with their rotational axes parallel, at least one of said transfer rollers being comprised of a plurality of independently-rotatable sub-rollers sharing the same axis of rotation, in a manner which effects twisting of the reinforcement material about its longitudinal axis after each successive pass through the vapour flux by an amount which is a fraction of 180°, thereby exposing a different aspect of the reinforcement to the vapour flux during each pass.

Preferred variations of the method will be apparent to the skilled reader on reading the preferred embodiments of the apparatus.

BRIEF DESCRIPTION OF THE DRAWINGS

The invention will now be described by way of example only with reference to the drawings in which.

DETAILED DISCUSSION OF PREFERRED EMBODIMENTS

Figure 1:
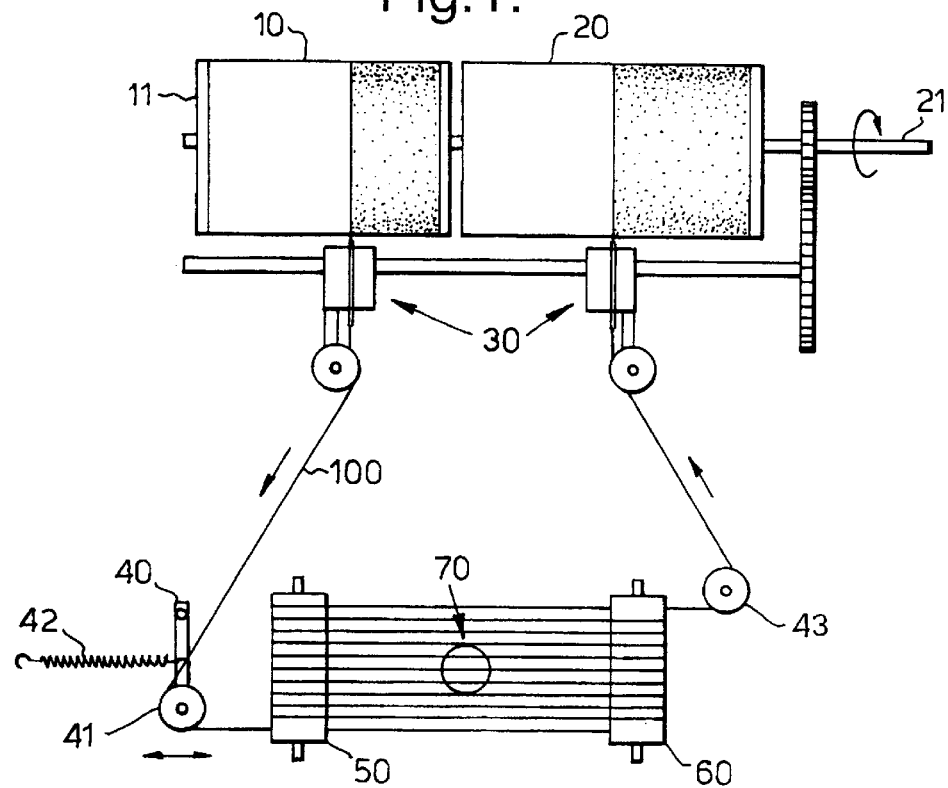
FIG. 1 is a schematic plan view of a fibre coating system in accordance with one embodiment of the invention.
Figure 2:
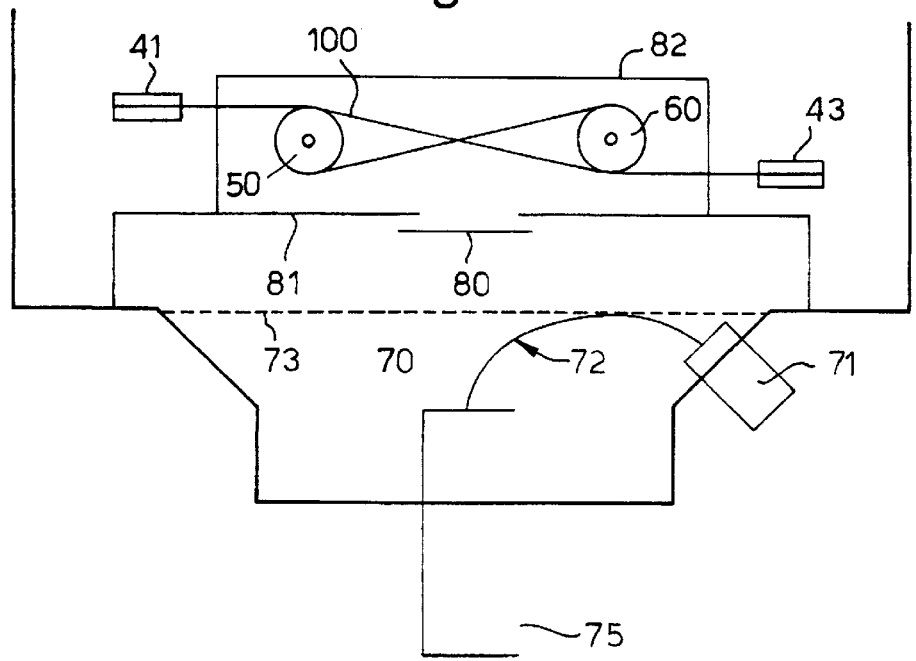
FIG. 2 is a schematic front sectional view of the fibre coating system shown in FIG. 1.

Referring now to FIGS. 1 and 2, there is shown in schematic form a physical vapour deposition apparatus and fibre transport system. It will be understood by persons skilled in the art that it is necessary to carry out physical vapour deposition under high vacuum. In the illustrated apparatus, the vacuum chamber has been omitted for clarity.

The fibre transport system comprises a supply spool 10 and a take-up spool 20. Before commencement of the coating operation, supply spool 10 is fully loaded with uncoated fibre 100 but, in FIG. 1, the supply spool 10 is shown partially depleted and the take-up spool 20 is shown partially loaded.

The fibre 100 may be any suitable ceramic fibre, such as alumina, silicon nitride, boron nitride, or even elemental boron. Typically, fibres ranging in diameter from 50 to 250 mm may be used, most preferably in the range 70 to 200 mm and especially in the range 100 to 140 mm. In the examples described below, silicon carbide fibres having diameters of 100 mm and 140 mm have been used.

On leaving the supply spool 10, the fibre 100 passes over guide 30 towards dancing arm 40 which is provided with a jockey wheel 41 around which the fibre 100 is threaded. Dancing arm 40 is spring-biased by a tension spring 42 which imparts an initial tension to the fibre before it is loaded onto the transfer rollers in the coating station.

As best seen with reference to FIG. 2, the transfer rollers 50, 60 are mounted above evaporation source 70 in the coating station. Evaporation source 70 is a master alloy rod 75 having the same alloy composition as the required matrix alloy. The rod 75 is intended to provide from 4–8 hours of evaporation, depending upon the evaporation power used. A typical rod source 75 has a diameter of 75 mm and a length of 130 mm. Evaporation is effected by an electron beam 72 which is emitted from an electron beam gun 71 of 45 kW capacity. The rod 75 is fed through a water-cooled copper hearth 83 which relies on the high thermal conductivity of copper to prevent damage to the crucible. Melting effectively takes place within a thin "skull" of solid alloy in contact with the copper. Hence, this technique is often referred to as the skull melting process.

The electron beam 72 is focused onto the centre of the rod 75 and creates a molten pool of metal fractionally below 75 mm in diameter and approximately 25 mm in depth. The rod can be raised at any desired rate to maintain a steady volume of liquid in the melt pool for evaporation. When the rod 75 is consumed, it can be replaced with new rods fed from below.

The fibre 100 passes back and forth repeatedly in a figure-of-eight path between transfer rollers 50 and 60. Initially, the fibre loops are shielded from the rising metal vapours by shutter 80. This is done so that the evaporation can be allowed to reach an equilibrium condition before the fibre is exposed to the vapour flux, in order to ensure that a constant composition of vapour is maintained during exposure. Other parts of the apparatus are protected from undesired exposure to metal vapours by a series of screens, such as upper and lower screens 82 and 81 illustrated schematically in FIG. 2.

On leaving the coating station, the fibre passes over another jockey wheel 43 on its way to take-up spool 20 via guide 30. Take-up spool 20 has an external chain drive 21 and the fibre 100 is drawn through the apparatus by means of this, tension being provided by a slipping clutch 11 on the supply spool 10. The supply spool 10 and the take-up spool 11 are mounted on a common rotating shaft which is powered by a remotely-controlled variable speed motor driving through a rotary vacuum seal (not shown). During coating, the supply spool runs free and the take-up spool is locked to the rotating shaft. As indicated above, both the supply spool 10 and the take-up spool 11 are provided with guides 30. These ensure that the fibre 100 always leaves the supply spool at right angles and is collected on the take-up spool with an even spacing between turns and without overlapping. The guides 30 are mounted on a common guide shaft, the rotation of which is geared to the take-up spool 20, such that the spooled fibre spacing remains constant regardless of winding speed.

Figure 3:
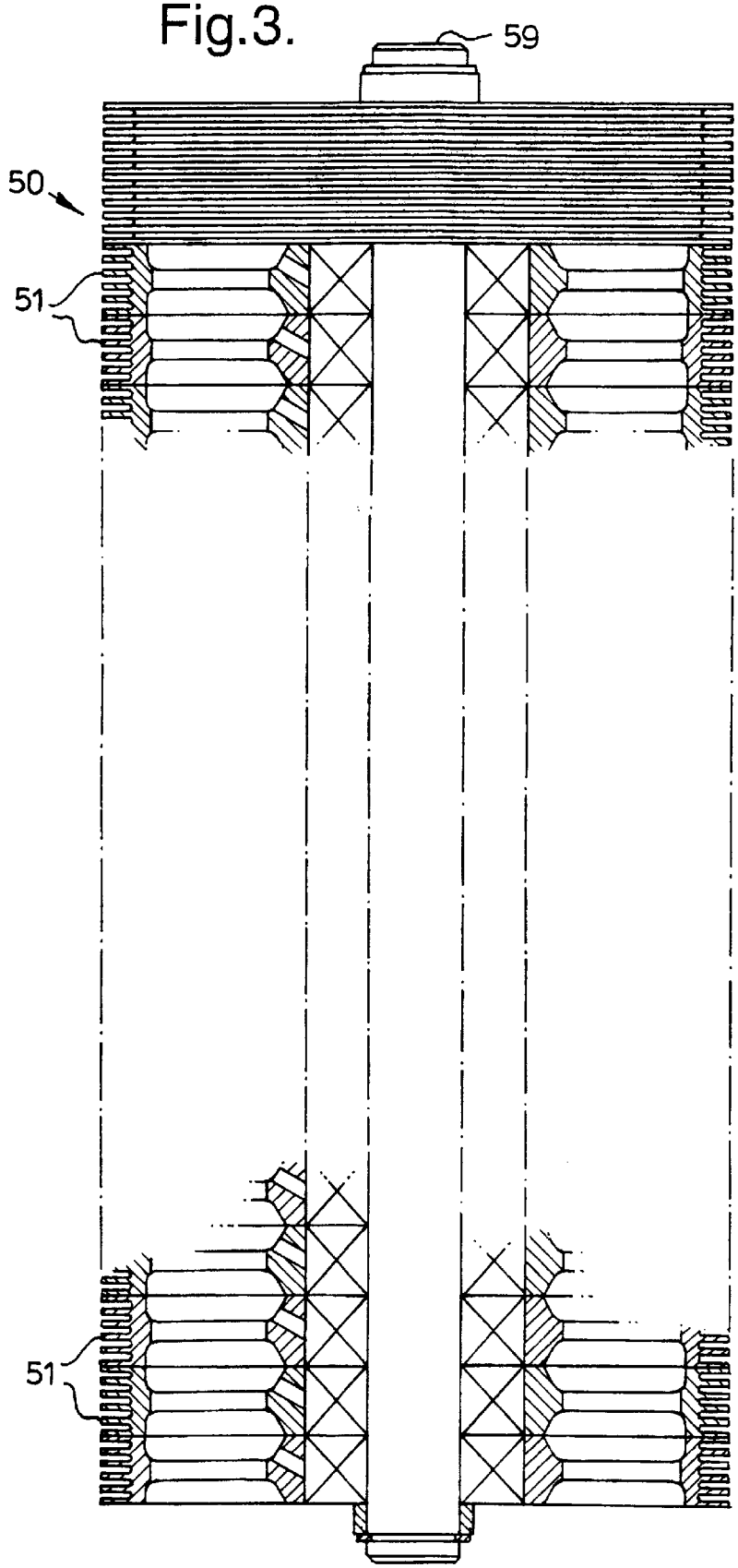
FIG. 3 is a part-sectional view of an assembly of sub-rollers forming a transfer roller in accordance with the invention.

Turning now to FIG. 3, it can be seen that transfer roller 50 is comprised of a number of sub-rollers 51. These are mounted on a common shaft 59 and each sub-roller 51 is capable of revolving on the shaft 59 independently of its neighbours. This independence of movement allows differences in fibre tension across the roller 50 to be compensated. As a result, the risk of fibre breakage is minimised.

Figure 4:
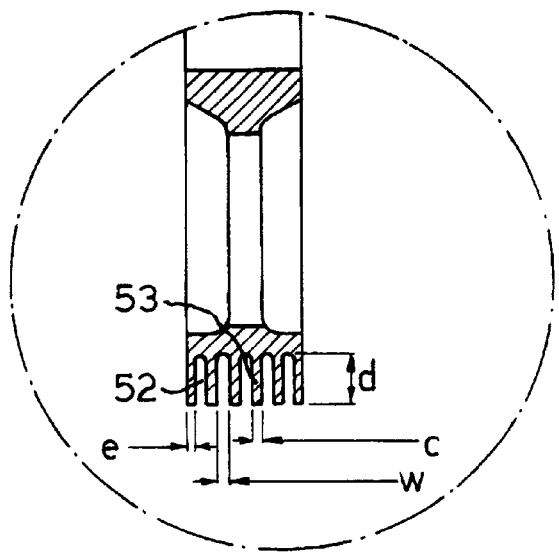
FIG. 4 is a detailed sectional view of a sub roller element from FIG. 3.

FIG. 4 shows a detail of one of the sub-rollers 51. In this particular embodiment, each of the sub-rollers 51 is formed with five concentric fibre-receiving grooves 52. The grooves 52 are radiused at their root portion 53, have a width w of 1.1 mm and a depth d of 5 mm. The spacing c between the grooves is 1 mm, except at the edges where the thickness e is only 0.7 mm. This means that the minimum spacing between the grooves 52 of adjacent sub-rollers 51 is 1.4 mm, assuming there is absolutely no gap between them. Clearly, it is preferable to minimise the gaps between adjacent subrollers to safeguard against fibre pinching between them in the event that severe slackening occurs during coating.

Although not illustrated as such, second transfer roller 60 may be constructed in the same way as transfer roller 50, i.e. from a plurality of multiple-grooved sub-rollers.

The purpose of the fibre-receiving grooves is two-fold. Their primary function is to establish an orderly path for the fibre as it executes its multiple figure-of-eight passes through the coating station. The grooves help to maintain even spacing between adjacent loops so that chafing does not occur, leading to increased transport friction and possible fibre breakage. However, the grooves also perform a secondary function of almost equal importance. Because the fibre tracks across the transfer rollers progressively from groove to groove, it makes non-symmetrical contact with the groove walls. As a result of this, the fibre is twisted slightly every time it passes around one of the transfer rollers 50, 60. Instead of executing a perfect 180° inversion, the fibre reorients by a fraction of this. Thus, as the fibre tracks across the transfer rollers, it is reoriented many times over and its entire circumference is exposed to the vapour flux to achieve uniform coating.

In referring to re-orientation of the fibre by a fraction of 180° in the preceding paragraph, it will be understood that the term "fraction" may also include improper fractions. In other words, re-orientation by more than 180° is also possible.

Figure 5:
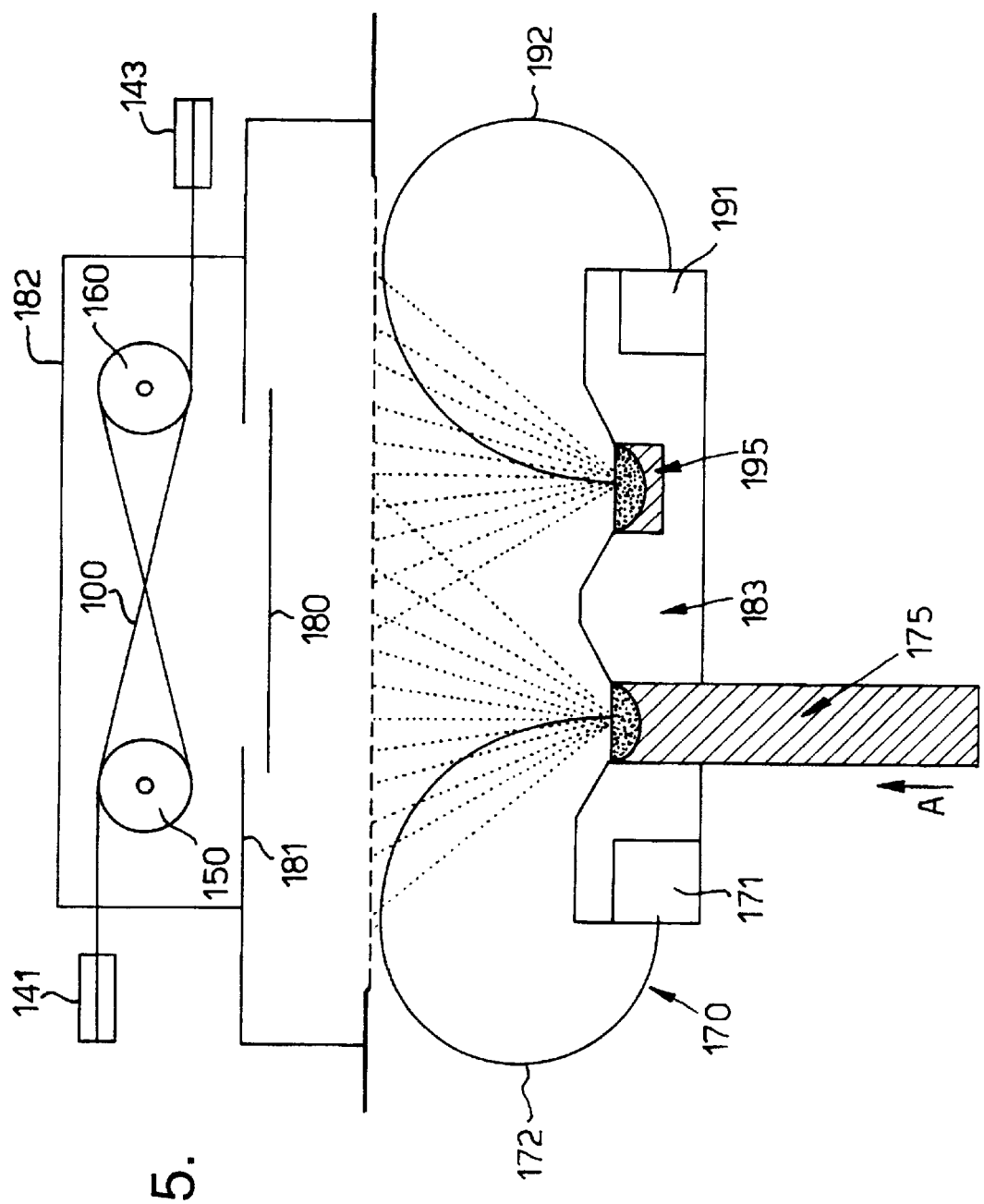
FIG. 5 is a schematic front sectional view of a second embodiment of apparatus in accordance with the invention.

In FIG. 5, a second embodiment of the apparatus is shown in which a further evaporation crucible 195 is provided. In the Figure, only a part of the transport system is shown for the fibre 100. To the left of the Figure, there is a first jockey wheel 141 which feeds fibre 100 from the supply spool (not shown) to a first multi-pass transfer roller 150. This roller is similar in configuration to the roller 50 described above in relation to the first embodiment. Its structure will not be discussed in further detail here.

The fibre 100 executes a plurality of figure-of-eight passes between first transfer roller 150 and second transfer roller 160 before being collected on a take-up spool (not shown) via second jockey wheel 143.

In similar fashion to the first embodiment described above, the coating station is shielded from the metal vapours by a remotely operable shutter 180. Screens 181 and 182 shield other parts of the apparatus from undesired exposure to metal vapours.

The first evaporation source 170 is a master alloy rod source 175 which is fed through water-cooled copper hearth 183 in the direction of arrow "A" as it is consumed.

The second evaporation source 190 is a plain source 195 (i.e. not rod fed) which is used as a source of minor constituents for the matrix.

The reason for using two separate evaporation sources is that electron beam evaporation from a single alloy bath is only effective if the vapour pressures of the constituent alloys are relatively close to each other at the bath temperature. Typically, the vapour pressures must lie within two orders of magnitude of each other. If they are more widely different than this, a second source is needed.

In the present embodiment, rod source 175 is used for the bulk matrix metal, i.e. titanium, plus those elements such as vanadium and aluminium which are suitable for alloy evaporation with titanium. Second source 195 is for refractory elements such as zirconium and molybdenum which have very much lower vapour pressures and require higher power electron beams to achieve evaporation.

The sources 175 and 195 each have their respective electron beam guns 171, 191, emitting beams 172, 192.

Although the spacing apart of the sources 175 and 195 means that fibre 100 is exposed to different compositions of vapour as it passes through the coating station, a certain amount of vapour mixing occurs, despite the absence of scattering. When the fibre is subsequently consolidated into a metal matrix composite, the heat treatment is sufficient to remove any minor modulation in composition through the thickness of the deposited matrix alloy.

Figure 6:
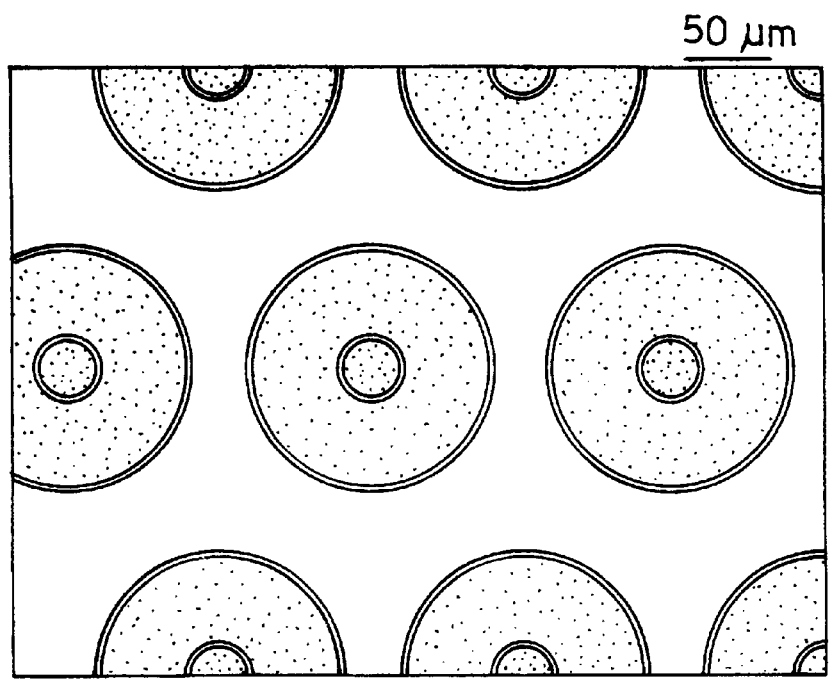
FIG. 6 is a microsectional view of a metal matrix composite material formed from fibres coated using apparatus according to the invention.

After coating, the fibre may be stored for long periods without detriment. Coated lengths of fibre may be consolidated by either vacuum hot pressing or hot isostatic pressing. FIG. 6 illustrates the regularity of fibre spacing which can be achieved in consolidated articles using matrix coated fibres whose coatings have been uniformly applied in apparatus according to the present invention.

Although the invention has been described above with reference to particular embodiments, it will be understood by persons skilled in the art that modifications are possible without departing from the scope of the claims which follow. In particular it will be understood by those skilled in the art that the invention as claimed includes embodiments where both multi-pass transfer rollers of a pair, such as those described as transfer rollers 50 and 60 in FIGS. 1, 2 and 3, comprise a plurality of independently-rotatable sub-rollers.

What is claimed is:

1. A physical vapour deposition apparatus for pre-coating fibres of a reinforcement material with a predetermined thickness of matrix metal prior to consolidation to yield a metal matrix composite material, the apparatus comprising:

at least one evaporation crucible;

a heater for heating a charge of metal in the at least one evaporation crucible to a temperature at which an appreciable vapour pressure is generated and a flux of metal vapour is evolved;

a powered take-up device for drawing the reinforcement through the apparatus, and a guide mechanism for guiding the reinforcement repeatedly through the vapour flux, the guide mechanism including rollers to effect twisting of the reinforcement about its longitudinal axis after each successive pass through the vapour flux by an amount which is a fraction of 180°, thereby exposing a different aspect of the reinforcement to the vapour flux during each pass, wherein the guide mechanism comprises a pair of multi-pass transfer rollers each transfer roller having a surface with a multiplicity of concentric fibre-receiving grooves, said transfer rollers being positioned above the evaporation crucible or crucibles and spaced apart from each other with their rotational axes parallel, at least one of said transfer rollers being comprised of a plurality of independently-rotatable sub-rollers sharing the same axis of rotation.

2. An apparatus as claimed in claim 1 wherein the number of fibre-receiving concentric grooves in each sub-roller lies in the range from 1 to 10.

3. An apparatus as claimed in claim 2 wherein the number of fibre-receiving concentric grooves in each sub-roller lies in the range from 5 to 8.

4. An apparatus as claimed in claim 1 wherein the number of fibre-receiving concentric grooves in each sub-roller varies across the width of one of the transfer rollers.

5. An apparatus as claimed in claim 1 wherein the width of the fibre-receiving grooves in the transfer rollers is between 4 and 25 times as great as the diameter of an uncoated fibre.

6. An apparatus as claimed in claim 1 wherein the depth of the fibre-receiving grooves is up to 100 times as great as the diameter of an uncoated fibre.

7. An apparatus as claimed in claim 1 further comprising a dancing arm provided between a fibre supply spool and the first of said transfer rollers.

8. An apparatus as claimed in claim 7 wherein the dancing arm is spring-biased to impart an initial tension to a fibre before it is loaded onto the first of said transfer rollers.

9. An apparatus as claimed in claim 7 wherein the dancing arm has a jockey wheel at its extremity over which the fibre passes in use.

10. A physical vapour deposition apparatus for pre-coating fibres of a reinforcement material with a predetermined thickness of matrix metal prior to consolidation to yield a metal matrix composite material, the apparatus comprising:

at least one evaporation crucible;

heating means for heating a charge of metal in the at least one evaporation crucible to a temperature at which an appreciable vapour pressure is generated and a flux of metal vapour is evolved;

a powered take-up device for drawing the reinforcement through the apparatus, and a guide mechanism for guiding the reinforcement repeatedly through the vapour flux, the guide mechanism including means to effect twisting of the reinforcement about its longitudinal axis after each successive pass through the vapour flux by an amount which is a fraction of 180°, thereby exposing a different aspect of the reinforcement to the vapour flux during each pass, wherein the guide mechanism comprises a pair of multi-pass transfer rollers each transfer roller having a surface with a multiplicity of concentric fibre-receiving grooves, said transfer rollers being positioned above the evaporation crucible or crucibles and spaced apart from each other with their rotational axes parallel, at least one of said transfer rollers being comprised of a plurality of independently-rotatable sub-rollers sharing the same axis of rotation.

11. A method for pre-coating fibres of a reinforcement material with a predetermined thickness of matrix metal prior to consolidation to yield a metal matrix composite material, comprising:

passing the reinforcement material over at least one evaporation crucible;

heating a charge of metal in the at least one evaporation crucible to a temperature at which a sufficient vapour pressure is generated for a flux of metal vapour to be evolved;

drawing the reinforcement material across the at least one evaporation crucible by means of a powered take-up device, and guiding the reinforcement material repeatedly through the vapour flux by means of a guide mechanism which comprises a pair of multi-pass transfer rollers, each roller having a surface with a multiplicity of concentric fibre-receiving grooves, said transfer rollers being positioned above the evaporation crucible or crucibles and spaced apart from each other with their rotational axes parallel, at least one of said transfer rollers being comprised of a plurality of independently-rotatable sub-rollers sharing the same axis of rotation, in a manner which effects twisting of the reinforcement material about its longitudinal axis after each successive pass through the vapour flux by an amount which is a fraction of 180°, thereby exposing a different aspect of the reinforcement to the vapour flux during each pass.

* * * * *